United States Patent
Chen et al.

(10) Patent No.: US 12,244,269 B2
(45) Date of Patent: Mar. 4, 2025

(54) POWER AMPLIFIER

(71) Applicant: RichWave Technology Corp., Taipei (TW)

(72) Inventors: Sheng-Ting Chen, Taipei (TW); Chih-Sheng Chen, Taipei (TW)

(73) Assignee: RichWave Technology Corp., Taipei (TW)

(*) Notice: Subject to any disclaimer, the term of this patent is extended or adjusted under 35 U.S.C. 154(b) by 587 days.

(21) Appl. No.: 17/544,914

(22) Filed: Dec. 7, 2021

(65) Prior Publication Data
US 2023/0105756 A1    Apr. 6, 2023

(30) Foreign Application Priority Data
Oct. 5, 2021 (TW) ................................ 110137008

(51) Int. Cl.
*H03F 3/24* (2006.01)
*H03F 1/02* (2006.01)

(52) U.S. Cl.
CPC ........... *H03F 1/0205* (2013.01); *H03F 3/245* (2013.01); *H03F 2200/451* (2013.01)

(58) Field of Classification Search
CPC .. H03F 1/0205; H03F 3/245; H03F 2200/451; H03F 3/19; Y02D 30/70
USPC ......................................................... 330/296
See application file for complete search history.

(56) References Cited

U.S. PATENT DOCUMENTS

| | | | |
|---|---|---|---|
| 2002/0084854 A1* | 7/2002 | Apel | H03F 1/302 330/296 |
| 2008/0079495 A1* | 4/2008 | Amano | H03F 3/195 330/296 |
| 2018/0138880 A1 | 5/2018 | Long | |
| 2018/0287560 A1* | 10/2018 | Choi | H03F 3/19 |

FOREIGN PATENT DOCUMENTS

| | | |
|---|---|---|
| TW | 200637139 | 10/2006 |
| TW | 200719579 | 5/2007 |
| TW | 200830698 | 7/2008 |
| TW | 202005265 A | 1/2020 |

OTHER PUBLICATIONS

Office action mailed on Apr. 21, 2022 for the Taiwan application No. 110137008, filing date Oct. 5, 2021, pp. 1-7.

\* cited by examiner

*Primary Examiner* — Andrea Lindgren Baltzell
*Assistant Examiner* — Khiem D Nguyen
(74) *Attorney, Agent, or Firm* — Winston Hsu (57) ABSTRACT

A power amplifier has an amplifying transistor, a first resistor, a bias circuit, a second resistor, and a compensation circuit. The amplifying transistor amplifies a radio frequency (RF) signal to output an amplified RF signal. A control end of the amplifying transistor receives the RF signal. The first resistor provides a first resistance, and a second end of the first resistor is coupled to the control end of the amplifying transistor. The bias circuit has a bias transistor and is coupled to a first end of the first resistor. The second resistor provides a second resistance less than the first resistance, and a second end of the second resistor is coupled to the control end of the amplifying transistor. The compensation circuit has a compensation transistor, and an output end of the compensation circuit is coupled to a first end of the second resistor.

20 Claims, 5 Drawing Sheets

POWER AMPLIFIER

TECHNICAL FIELD

The present invention relates to a power amplifier, especially a power amplifier that would obtain a better power added efficiency (PAE) even at a high back off power.

BACKGROUND

Amplifiers are common components in electronic devices for amplifying signals to achieve desired gain, bandwidth, linearity, and other characteristics of the electronic devices. Amplifiers have a wide range of applications, such as active filters, buffers, analog to digital converters, and radio frequency transceivers. Moreover, in the field of wireless communication, a power amplifier is an important component in a radio frequency circuit, and is usually designed at the front end of an antenna transmitter. The main function of a power amplifier is to amplify an output signal to obtain a reasonable output power level.

In a conventional power amplifier, a bias resistor is usually coupled to the control end of a power transistor. However, as the output power of the power amplifier increases, the current flowing through the bias resistor will also increase, resulting that the gain of the power amplifier at high power may be compromised.

SUMMARY

An embodiment of the present invention provides a power amplifier, which comprises an amplifying transistor, a first resistor, a bias circuit, a second resistor, and a compensation circuit. The amplifying transistor is configured to amplify a radio frequency (RF) signal and output an amplified RF signal. As for the amplifying transistor, a control end of receives the RF signal, a first end is coupled to a first system voltage end, and a second end is coupled to a first reference voltage end. The first end of the amplifying transistor is configured to output the amplified RF signal. The first resistor is configured to provide a first resistance, and a second end of the first resistor is coupled to the control end of the amplifying transistor. The bias circuit comprises a bias transistor coupled to a first end of the first resistor. The second resistor is configured to provide a second resistance less than the first resistance, and a second end of the second resistor is coupled to the control end of the amplifying transistor. The compensation circuit comprises a compensation transistor, and an output end of the compensation circuit is coupled to a first end of the second resistor.

Another embodiment of the present invention provides a power amplifier, which comprises an amplifying transistor, a first resistor, a bias circuit, and a compensation circuit. The amplifying transistor is configured to amplify a radio frequency (RF) signal and output an amplified RF signal. As for the amplifying transistor, a control end of receives the RF signal, a first end is coupled to a first system voltage end, and a second end of is configured to output the amplified RF signal. The first resistor is configured to provide a first resistance, and a second end of the first resistor is coupled to the control end of the amplifying transistor. The bias circuit comprises a bias transistor and is coupled to a first end of the first resistor. The compensation circuit comprises a compensation transistor, and an output end of the compensation circuit is coupled to the control end of the amplifying transistor. Resistance between the control end of the amplifying transistor and the bias transistor is greater than resistance between the control end of the amplifying transistor and the compensation transistor.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
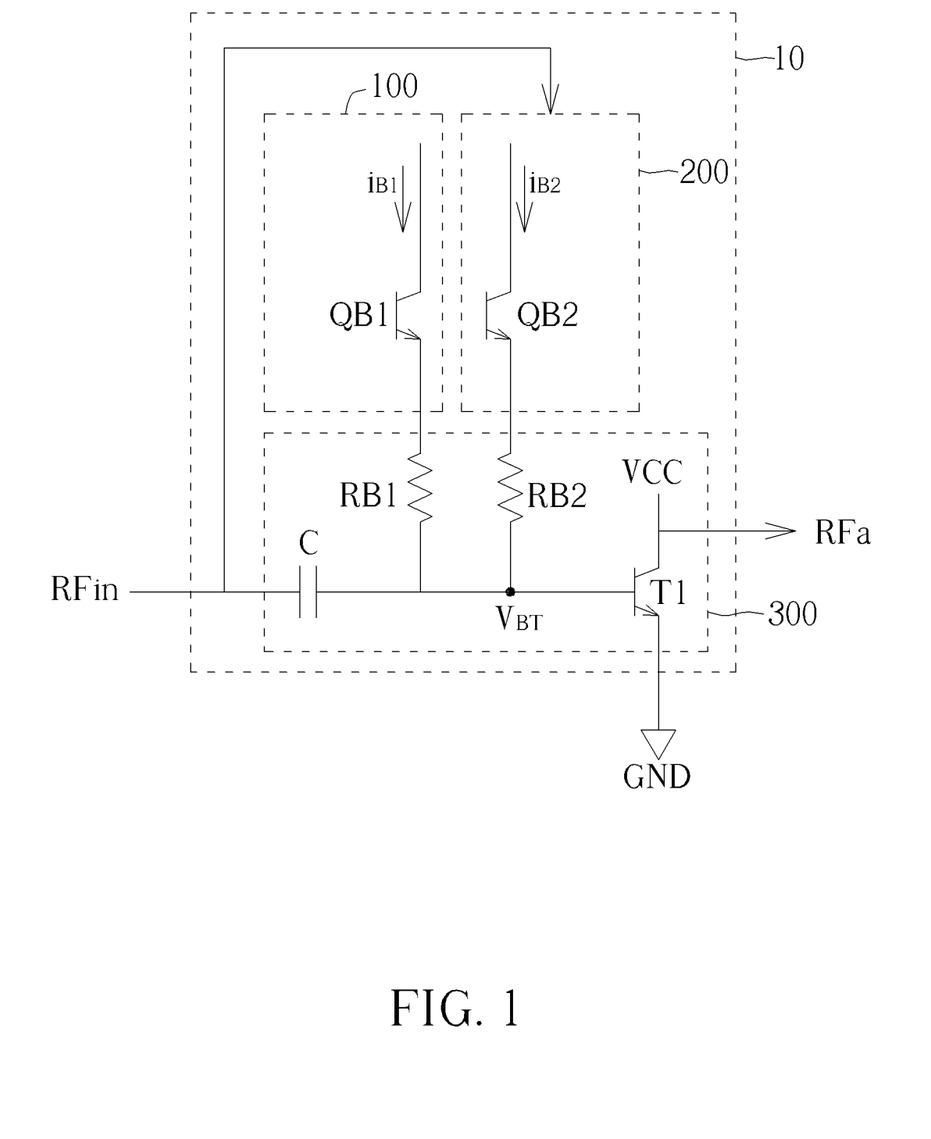
FIG. 1 is a circuit diagram of a power amplifier according to an embodiment of the present invention.

FIG. 1 is a circuit diagram of a power amplifier 10 according to an embodiment of the present invention. The power amplifier 10 comprises a bias circuit 100, a compensation circuit 200, and a core circuit 300. The core circuit 300 comprises an amplifying transistor T1, a resistor RB1, and a resistor RB2. The amplifying transistor T1 is configured to amplify a radio frequency (RF) signal RFin and output an amplified radio frequency signal RFa. A control end of the amplifying transistor T1 receives the radio frequency signal RFin, and a first end of the amplifying transistor T1 is coupled to a first system voltage end VCC for receiving a first system voltage. A second end of the amplifying transistor T1 is coupled to the first reference voltage end GND, and the first reference voltage end GND is configured to provide a ground voltage or other reference voltage lower than the voltage level of the first system voltage end VCC. The first end of the amplifying transistor T1 is coupled to a matching circuit so as to output the amplified radio frequency signal RFa, or the first end of the amplifying transistor T1 is coupled to a next-stage amplifying circuit. A first end of the resistor RB1 is coupled to the output end of the bias circuit 100, a first end of the resistor RB2 is coupled to the output end of the compensation circuit 200, and a second end of the resistor RB1 and a second end of the resistor RB2 are both coupled to a control end of the amplifying transistor T1. The resistor RB1 is configured to provide a first resistance, and the resistor RB2 is configured to provide a second resistance. Furthermore, the bias circuit 100 comprises a bias transistor QB1, which would provide a bias current $i_{B1}$. The compensation circuit 200 comprises a compensation transistor QB2, which would provide a compensation current $i_{B2}$. The compensation transistor QB2 of the compensation circuit 200's operation region may be controlled according to the radio frequency signal RFin.

In some embodiments, the resistance between the control end of the amplifying transistor T1 and the bias transistor QB1 is greater than the resistance between the control end of the amplifying transistor T1 and the compensation transistor QB2. As shown in FIG. 1, the first resistance of the resistor RB1 is greater than the second resistance of the resistor RB2. For example, the first resistance may be one or more hundred times the second resistance, but the present invention is not such limited. The ratio between the second resistance and the first resistance may be adjusted and optimized according to the specification requirements of the power amplifier 10.

In some embodiments, the first system voltage end VCC may provide a direct-current (DC) voltage, and the voltage provided by the first system voltage end VCC may not change with the power of the radio frequency signal RFin.

In the embodiment shown in FIG. 1, since the second end of the resistor RB1 and the second end of the resistor RB2 are both coupled to the control end of the amplifying transistor T1, the resistor RB1 and the resistor RB2 are in likewise parallel with each other, so that the equivalent resistance of the combination of the resistors RB1 and RB2 may approximately be a parallel resistance of the resistors RB1 and RB2, and the equivalent resistance is less than the first resistance of the resistor RB1 and less than the second resistance of the resistor RB2. In the absence of compensation transistor QB2 and the resistor RB2, the greater the power of the RF signal RFin, the greater the current flowing through the bias transistor QB1, which will cause an increase in the cross voltage of the resistor RB1, thereby pulling down a node voltage $V_{BT}$ and affecting the operations of the amplifying transistor T1. In the embodiment, when the power of the radio frequency signal RFin is great enough, the bias transistor QB1 and the compensation transistor QB2 are both turned on, thereby providing a greater driving current. Since the equivalent resistance of the resistors RB1 and RB2 is less than the first resistance of the resistor RB1 and less than the second resistance of the resistor RB2, a bias voltage at the control end of the power transistor T1 (i.e., the node voltage $V_{BT}$) would be maintained relatively stable. Therefore, the gain of the power amplifier 10 for the radio frequency signal RFin may not be such affected and the saturation output power of the power amplifier 10 may not be reduced.

In an embodiment of the present invention, when the power of the radio frequency signal RFin is a first power, the bias transistor QB1 is turned on, the compensation transistor QB2 is turned off, the compensation current $i_{B2}$ is almost zero, and the bias current $i_{B1}$ is greater than the compensation current $i_{B2}$. When the power of the radio frequency signal RFin increases, the conduction degree of the compensation transistor QB2 would be increased to provide an appropriate compensation current $i_{B2}$. When the power of the radio frequency signal RFin is further increased to a second power, both the bias transistor QB1 and the compensation transistor QB2 are turned on. Since the first resistance of the resistor RB1 is greater than the second resistance of the resistor RB2, the bias current $i_{B1}$ would be less than the compensation current $i_{B2}$.

Figure 2:
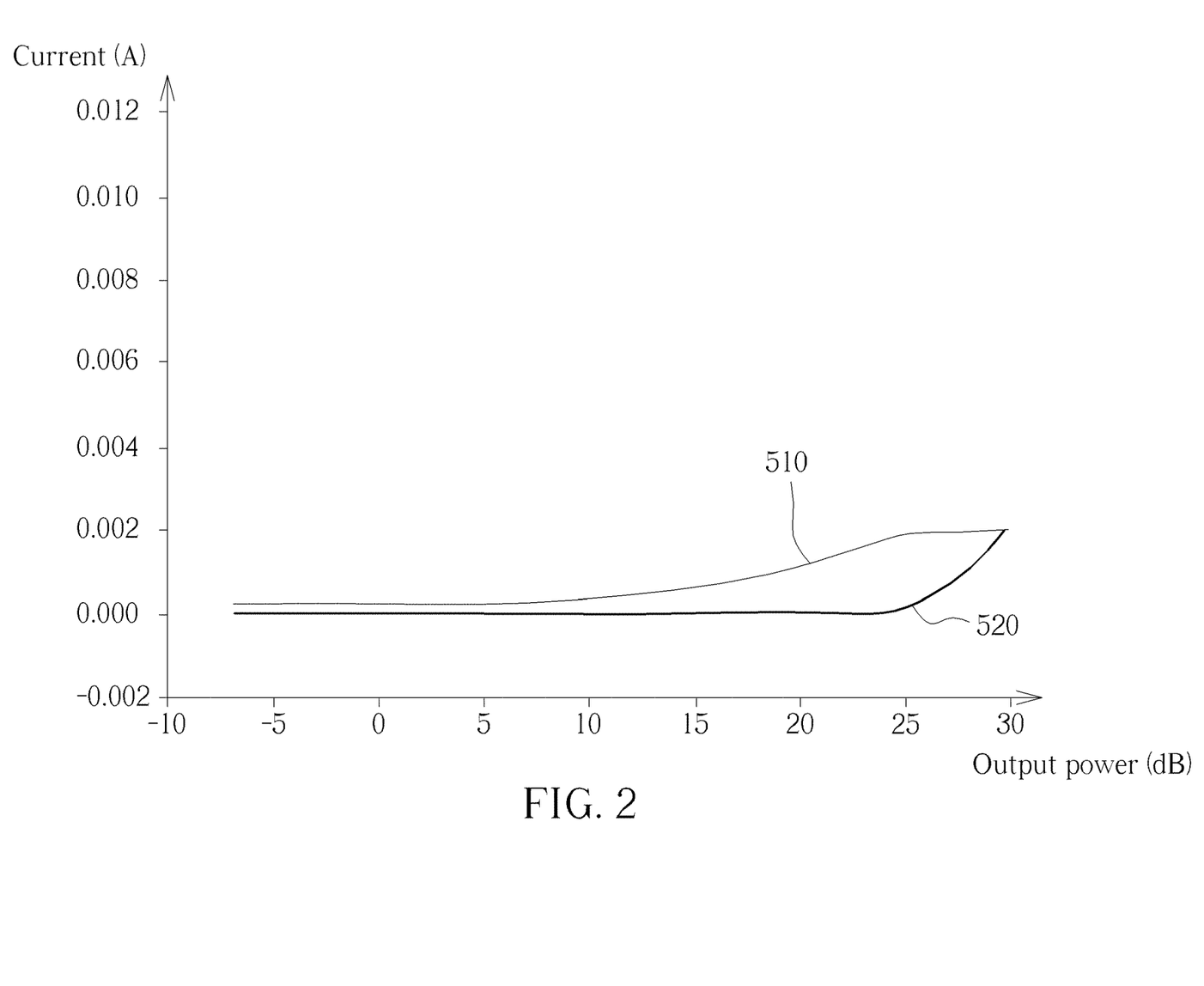
FIG. 2 shows a relationship between the bias current and the output power of the power amplifier in FIG. 1 and a relationship between the compensation current and the output power of the power amplifier.

FIG. 2 shows a relationship curve 510 between the bias current $i_{B1}$ and the output power of the power amplifier 10 in FIG. 1 and a relationship curve 520 between the compensation current $i_{B2}$ and the output power of the power amplifier 10. In an embodiment of the present invention, when the power amplifier 10 is powered, the bias transistor QB1 would be turned on to provide the bias current $i_{B1}$. When the power of the radio frequency signal RFin is low, the compensation transistor QB2 is turned off. When the power of the radio frequency signal RFin is high enough, the output power of the power amplifier 10 may be relatively high, and both the bias transistor QB1 and the compensation transistor QB2 would be turned on to provide the bias current $i_{B1}$ and the compensation current $i_{B2}$ respectively. The bias current $i_{B1}$ flows through the resistor RB1, and the compensation current $i_{B2}$ flows through the resistor RB2. For example, as shown in FIG. 2, when the output power of the power amplifier 10 is less than about 23 dB, the compensation transistor QB2 is turned off, and the bias transistor QB1 is turned on, such that the drive current for the amplifying transistor T1 is approximately equal to the bias current $i_{B1}$. When the output power of the power amplifier 10 is approximately equal to or greater than 23 dB, both the bias transistor QB1 and the compensation transistor QB2 are turned on, such that the drive current for the amplifying transistor T1 is approximately equal to the sum of the bias current $i_{B1}$ and the compensation current $i_{B2}$ (i.e., approximately equal to $i_{B1}+i_{B2}$). In the embodiment, the power amplifier 10 may operate in a back off region where the bias transistor QB1 is turned on and the compensation transistor QB2 is turned off. In this case, the power amplifier 10 may be operated as a class-B amplifier to obtain a better power added efficiency (PAE). When the output power of the power amplifier 10 is great enough, both the bias transistor QB1 and the compensation transistor QB2 are turned on. In this case, the equivalent resistance of the resistors RB1 and RB2 is relatively reduced, so that the saturation output power of the power amplifier 10 would be increased.

Figure 3:
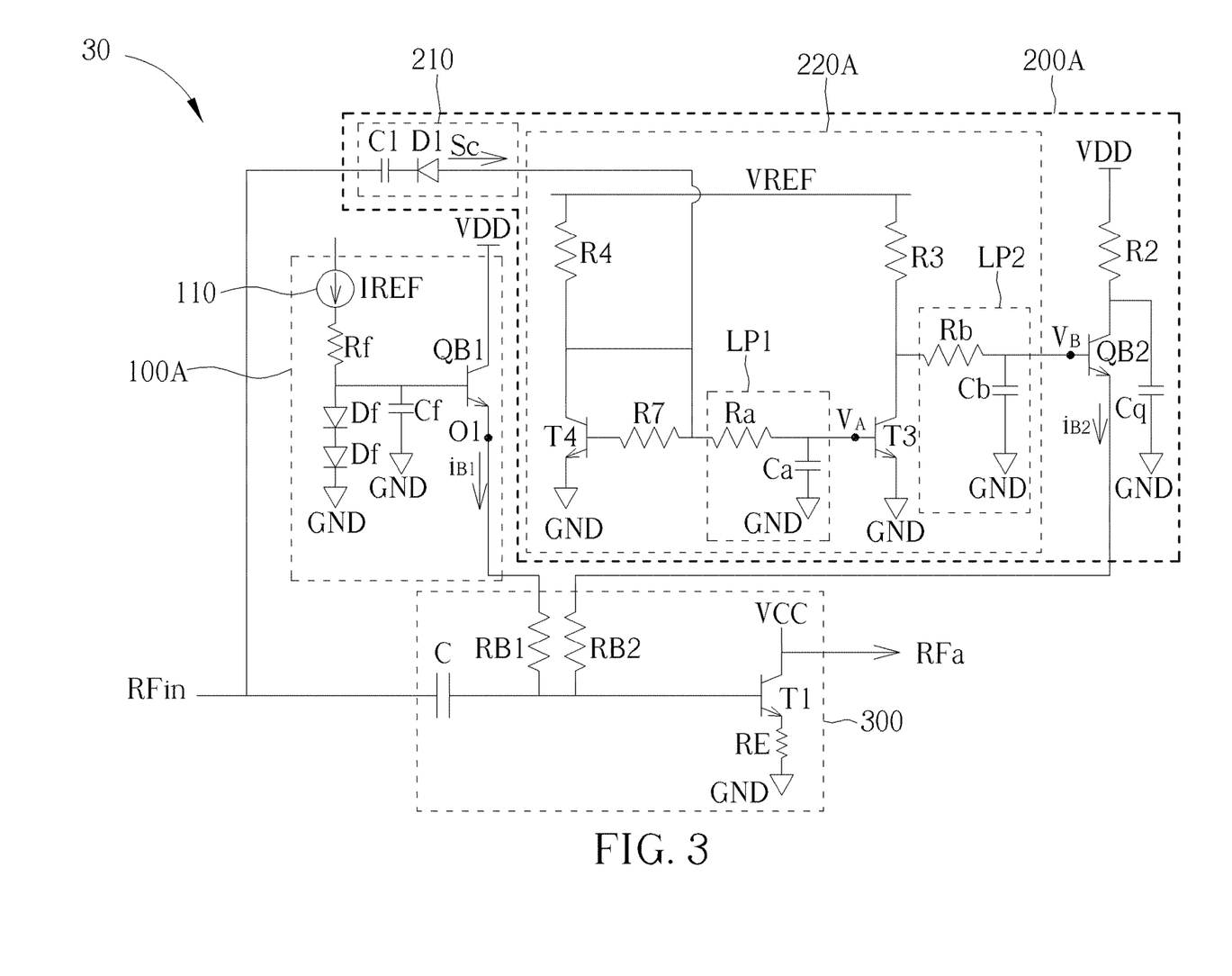
FIG. 3 is a circuit diagram of a power amplifier according to another embodiment of the present invention.

FIG. 3 is a circuit diagram of a power amplifier 30 according to an embodiment of the present invention. The power amplifier 30 comprises a bias circuit 100A, a compensation circuit 200A, and a core circuit 300. The functions and operations of the core circuit 300 are similar to those of the core circuit 300 in FIG. 1. For this part, please refer to the above description, which will not be repeated here. An example of the compensation circuit 200A is further described below.

As shown in FIG. 3, the compensation circuit 200A comprises a detection circuit 210, a voltage adjustment circuit 220A, and a compensation transistor QB2. The detection circuit 210 is configured to generate a detection signal Sc according to the radio frequency signal RFin (e.g., according to the power of the radio frequency signal RFin). In an embodiment of the present invention, the detection circuit 210 comprises a diode D1. The cathode of the diode D1 is coupled to the input end of the detection circuit 210, and the anode is coupled to the output end of the detection circuit 210. In the embodiment, the diode D1 would clip the radio frequency signal RFin to generate the detection signal Sc. The detection circuit 210 may further comprise a capacitor C1, and the capacitor C1 may be coupled between the input end of the detection circuit 210 and the diode D1, or coupled between the diode D1 and the output end of the detection circuit 210. The capacitor C1 is configured to block a direct-current (DC) part of the radio frequency signal RFin.

As shown in FIG. 3, in an embodiment of the present invention, the input end of the voltage adjustment circuit 220A may be coupled to the output end of the detection circuit 210, and the output end of the voltage adjustment circuit 220A is configured to output the adjustment voltage $V_B$ to the control end of the compensation transistor QB2. Furthermore, the voltage adjustment circuit 220A would adjust the adjustment voltage $V_B$ according to the detection signal Sc, and the compensation transistor QB2 is turned on/off according to the adjustment voltage $V_B$. For example, when the compensation transistor QB2 is turned on, the compensation transistor QB2 would provide the compensation current $i_{B2}$ flowing to the control end of the amplifying transistor T1. In other words, the compensation transistor QB2 would be turned off or turned on according to the detection signal Sc, thereby selectively providing the compensation current $i_{B2}$.

As shown in FIG. 3, in the embodiment, the voltage adjustment circuit 220A comprises a resistor R3, a transistor T3, a resistor R4, and a transistor T4. A first end of the resistor R3 is coupled to a second reference voltage end VREF, a second end of the resistor R3 is coupled to a first end of the transistor T3, and a second end of the transistor T3 is coupled to the first reference voltage end GND. The control end of the transistor T3 is coupled to the input end of the voltage adjustment circuit 220A, so as to receive the detection signal Sc. As shown in FIG. 3, the first end of the transistor T3 may be coupled to the output end of the voltage adjustment circuit 220A, so as to output the adjustment voltage $V_B$. A first end of the resistor R4 is coupled to the second reference voltage end VREF, and a second end of the resistor R4 is coupled to a first end of the transistor T4. A second end of the transistor T4 is coupled to the first reference voltage end GND, and a control end of the transistor T4 may be coupled to the first end of the transistor T4. In other words, the second end of the resistor R4, the first end of the transistor T4, and the control end of the transistor T4 are coupled to each other, and are further coupled to the input end of the voltage adjustment circuit 220A. In other embodiments, the voltage adjustment circuit 220A further comprises a resistor R7. A first end of the resistor R7 may be coupled to the control end of the transistor T4, and a second end is coupled to the input end of the voltage adjustment circuit 220A. As shown in FIG. 3, the first end and the control end of the transistor T4 are coupled to each other via the resistor R7.

As shown in FIG. 3, in an embodiment of the present invention, the voltage adjustment circuit 220A comprises a filter LP1. The filter LP1 is coupled between the input end of the voltage adjustment circuit 220A and the control end of the transistor T3. Furthermore, the filter LP1 may comprise a resistor Ra and a capacitor Ca. One end of the resistor Ra is coupled to the input end of the voltage adjustment circuit 220A, and the other end is coupled to the control end of the transistor T3. One end of the capacitor Ca is coupled to the control end of the transistor T3, and the other end is coupled to the first reference voltage end GND. The voltage adjustment circuit 220A may further comprise a filter LP2, which comprises a resistor Rb and a capacitor Cb. The filter LP2 is coupled between the first end of the transistor T3 and the output end of the voltage adjustment circuit 220A. That is, the first end of the transistor T3 may be coupled to the output end of the voltage adjustment circuit 220A via the filter LP2. Furthermore, one end of the resistor Rb may be coupled to the first end of the transistor T3, and the other end may be coupled to the output end of the voltage adjustment circuit 220B. One end of the capacitor Cb is coupled to the above other end of the resistor Rb, and the other end of the capacitor Cb is coupled to the first reference voltage end GND. In some embodiments, the filter LP1 and/or the filter LP2 may be low-pass filters, which allow lower-frequency signals to pass. In the above embodiments, the capacitance of the capacitor Cb may be greater than the capacitance of the capacitor Ca. For example, the capacitance of the capacitor Ca can be 1 to 2 picofarads (1 PF to 2 PF), and the capacitance of the capacitor Cb can be 8 picofarads (8 PF), but the present invention is not such limited. The capacitance of capacitor Ca and the capacitance of the capacitor Cb may be adjusted according to the specification requirements of the voltage adjustment circuit 220A.

In an embodiment of the present invention, the compensation circuit 200A may further comprise a compensation capacitor Cq coupled between the first end of the compensation transistor QB2 and the first reference voltage end GND.

Figure 5:
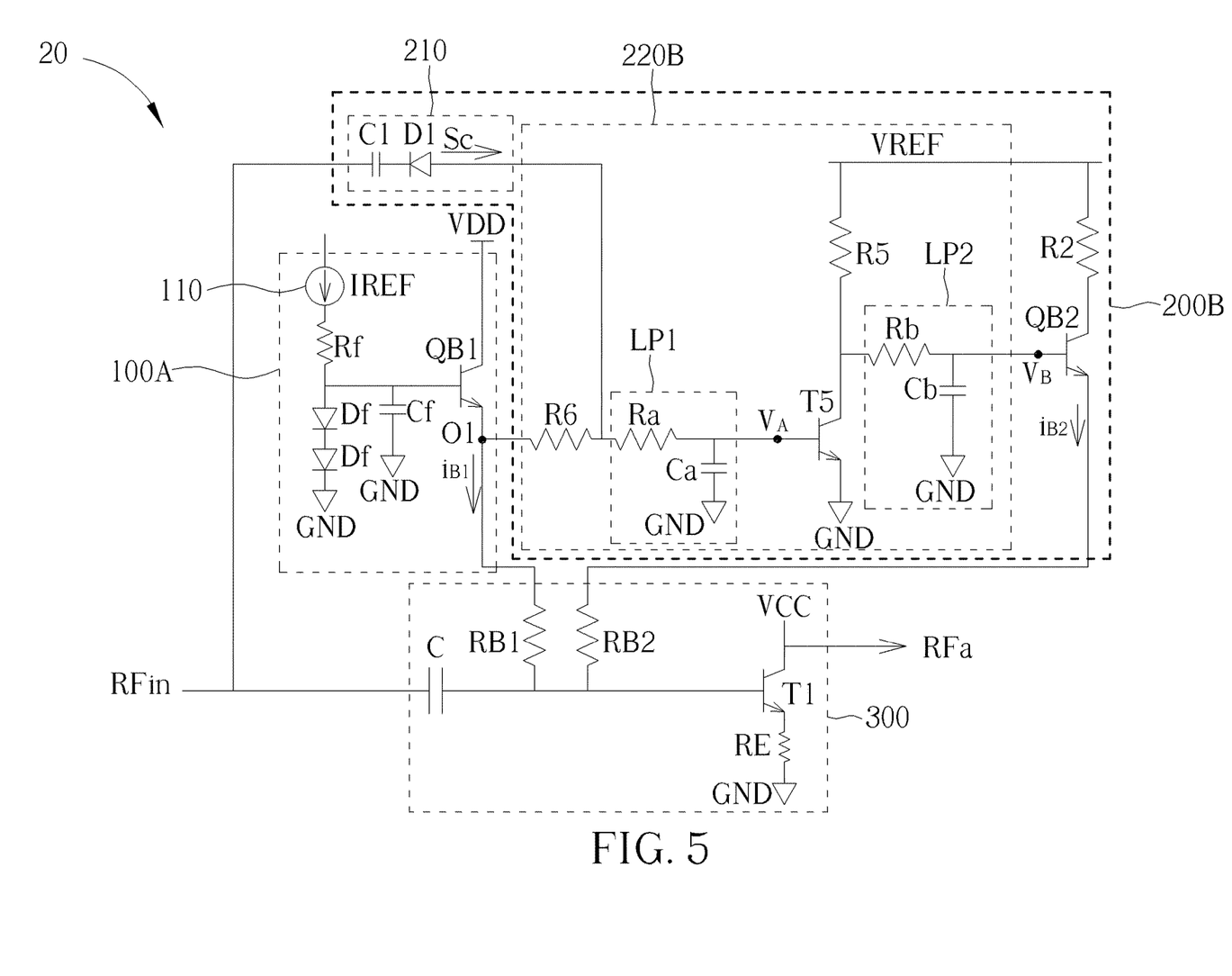
FIG. 5 is a circuit diagram of a power amplifier according to another embodiment of the present invention.

As shown in FIG. 3, in an embodiment of the present invention, as for the compensation transistor QB2, the first end of may be coupled to a device voltage end VDD, the second end may be coupled to the first end of the resistor RB2, and the control end may be coupled to the output end of the voltage adjustment circuit 220A so as to receive the adjustment voltage $V_B$. In a further embodiment, the compensation circuit 200A may further comprise a compensation resistor R2, a first end of which is coupled to the device voltage end VDD, and a second end of which is coupled to the first end of the compensation transistor QB2. In other embodiments, the first end of the compensation resistor R2 may also be coupled to the second reference voltage end VREF (as shown in FIG. 5).

In some embodiments, when the power of the radio frequency signal RFin changes, the detection signal Sc generated by the detection circuit 210 changes accordingly. For example, when the power of the radio frequency signal RFin increases, the average voltage of the detection signal Sc output by the detection circuit 210 decreases due to the clipping effect (on the radio frequency signal RFin of the reversely connected diode D1 in the detection circuit 210. As shown in FIG. 3, the rectification by the filter LP1 reduces the node voltage $V_A$. That is, the voltage at the control end of the transistor T3 is reduced, thereby reducing the conduction degree of the transistor T3. In this case, the current flowing between the first end and the second end of the transistor T3 would decrease, so that the voltage across two ends of the resistor R3 decreases. Accordingly, the voltage at the first end of the transistor T3 increases, and the adjustment voltage $V_B$ of the voltage adjustment circuit 220A increases. When the adjustment voltage $V_B$ increases to be greater than a predetermined value, the compensation transistor QB2 is turned on. Meanwhile, the compensation transistor QB2 would provide the compensation current $i_{B2}$ flowing to the control end of the amplifying transistor T1.

As shown in FIG. 3, in an embodiment of the present invention, the bias circuit 100A is similar to the bias circuit 100 in FIG. 1 with the difference that, in addition to the bias voltage transistor QB1, the circuit 100A may further comprise a reference current source 110, a reference resistor Rf, at least one diode Df (e.g., two diodes Df as shown in FIG. 3), and a capacitor Cf. The reference current source 110 is configured to provide a reference current IREF. A first end of the reference resistor Rf is coupled to the reference current source IREF, and a second end of the reference resistor Rf is coupled to the control end of the bias transistor QB1. In the embodiment, the number of diodes Df is two, but the invention is not such limited. The bias circuit 100A may comprise three or more diodes Df connected in series. The diodes Df of the bias circuit 100A are coupled between the second end of the reference resistor Rf and the first reference voltage end GND, so as to control the bias voltage at the control end of the bias voltage transistor QB1, so that an output end O1 of the bias circuit 100A mat provide the bias current $i_{B1}$. The capacitor Cf may be coupled between the control end of the bias transistor QB1 and the first reference voltage end GND.

Figure 4:
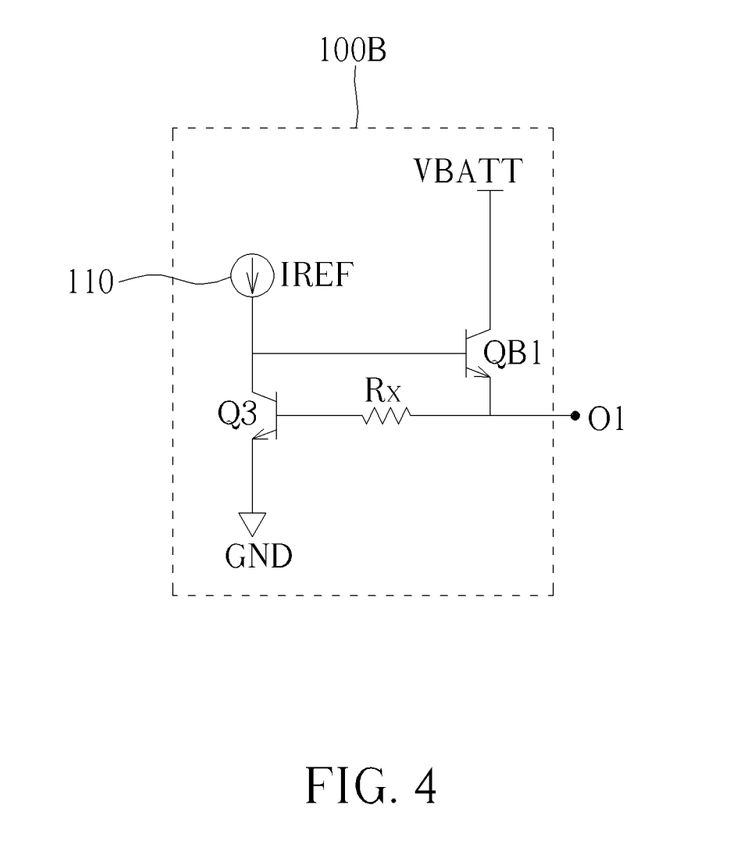
FIG. 4 is a circuit diagram of a bias circuit of a power amplifier according to another embodiment of the present invention.

FIG. 4 is a circuit diagram of a bias circuit 100B of a power amplifier according to another embodiment of the present invention. The bias circuit 100B is configured to replace the bias circuit 100A in FIG. 3. The bias circuit 100B comprises a bias transistor QB1, a reference current source 110, and a transistor Q3. The reference current source 110 is configured to provide the reference current IREF, and the output end of the reference current source 110 is coupled to a control end of the bias transistor QB1. As for the transistor Q3, a first end of is coupled to the output end of the reference current source 110, a second end is coupled to the first reference voltage end GND, and a control end is coupled to the second end of the bias transistor QB1 and coupled to the output end O1 of the bias circuit 100B. In the embodiment, the first end of the bias transistor QB1 may be coupled to a battery voltage end VBATT, and the battery voltage end VBATT is configured to receive a voltage provided by an external battery. In other embodiments, the first end of the bias transistor QB1 may also be coupled to the device voltage end VDD (as shown in FIG. 3). In a further embodiment, the bias circuit 100B may further comprise a resistor Rx, a first end of the resistor Rx is coupled to the control end of the transistor Q3, and a second end of the resistor Rx is coupled to the second end of the bias transistor QB1. In the embodiment, the output end O1 of the bias circuit 100B may be coupled to the first end of the resistor RB1 (as shown in FIG. 3).

FIG. 5 is a circuit diagram of a power amplifier 20 according to another embodiment of the present invention. The power amplifier 20 comprises the bias circuit 100A, a compensation circuit 200B, and the core circuit 300. The compensation circuit 200B comprises a detection circuit 210, a voltage adjustment circuit 220B, and a compensation transistor QB2. In the embodiment, the bias circuit 100A, the core circuit 300, the detection circuit 210 of the compensation circuit 200B, and the compensation transistor QB2 of the compensation circuit 200B are similar to those in FIG. 3, which will not be repeated here. Hereinafter, an example of the voltage adjustment circuit 220B of the compensation circuit 200B is further described.

As shown in FIG. 5, in an embodiment of the present invention, the voltage adjustment circuit 220B comprises a resistor R5, a transistor T5, and a resistor R6. As for the resistor R5, a first end of is coupled to the second reference voltage end VREF, and a second end is coupled to a first end of the transistor T5. As for the transistor T5, a second end of is coupled to the first reference voltage end GND, and a control end is coupled to the input end of the voltage adjustment circuit 220B so as to receive the detection signal Sc. As shown in FIG. 5, the first end of the transistor T5 may be coupled to the output end of the voltage adjustment circuit 220B to output the adjustment voltage $V_B$. A first end of the resistor R6 is coupled to the bias circuit 100A, specifically, to the second end of the bias transistor QB1 of the bias circuit 100A. A second end of the resistor R6 is coupled to the input end of the voltage adjustment circuit 220B.

As shown in FIG. 5, in an embodiment of the present invention, the voltage adjustment circuit 220B comprises a filter LP1 and/or a filter LP2. The filter LP1 is coupled between the input end of the voltage adjustment circuit 220A and the control end of the transistor T5, and/or the filter LP2 is coupled between the first end of the transistor T5 and the output end of the voltage adjustment circuit 220B. The filter LP1 and/or the filter LP2 may be similar to those shown in FIG. 3, which will not be repeated here.

When the voltage of the detection signal Sc increases, the conduction degree of the transistor T5 increases, and the current flowing between the first end and the second end of the transistor T5 increases, resulting in an increase in voltage across the two ends of the resistor R5. Therefore, the voltage level at the first end of the transistor T5 decreases, so that the adjustment voltage $V_B$ provided by the voltage adjustment circuit 220B decreases. When the adjustment voltage $V_B$ drops below a predetermined value, the compensation transistor QB2 is turned off, where the compensation transistor QB2 stop providing the compensation current $i_{B2}$ flowing to the control end of the amplifying transistor T1. Similar to the related description in FIG. 3, when the voltage level of the detection signal Sc decreases, the conduction degree of the transistor T5 decreases, which in turn causes the adjustment voltage $V_B$ to increase. It may be noted that the detection signal Sc is generated according to the radio frequency signal RFin clipped by the diode D1. The diode D1 may cut off the upper swing of the radio frequency signal RFin. Therefore, the higher the power of the radio frequency signal RFin is, the larger the swing of the radio frequency signal RFin is, and the more of the swing of the radio frequency signal RFin may be clipped off by the diode D1. However, since the lower swing of the radio frequency signal RFin may also be larger, an average voltage of the detection signal Sc is reduced and the node voltage $V_A$ is therefore reduced. When the node voltage $V_A$ decreases, the conduction degree of the transistor T5 will decrease, and the current flowing through the resistor R5 will decrease. When the current flowing through the resistor R5 decreases, the voltage across the two ends of the resistor R5 will also decrease, so that the adjustment voltage $V_B$ increases and the compensation transistor QB2 is turned on to provide the compensation current $i_{B2}$. In addition, the reference voltage provided by the second reference voltage end VREF may be adjusted according to the characteristics (e.g., resistance) of the components of the voltage adjustment circuit 220B, so that the compensation transistor QB2 of the voltage adjustment circuit 220B would be turned on to provide the compensation current $i_{B2}$ when the node voltage $V_A$ drops to a predetermined voltage (correspondingly, when the adjustment voltage $V_B$ increases to be greater than a predetermined value).

In the above embodiments, it is noted that the input end of the detection circuit 210 is coupled to the input end of the core circuit 300 which belongs to the same-stage power amplifier (e.g., the power amplifier 30 in FIG. 3), to receive the radio frequency signal RFin. However, the present invention is not such limited. In other embodiments, the input end of the detection circuit 210 may also be coupled to an input end of a pre-stage or post-stage power amplifier, so as to receive the input radio frequency signal of the pre-stage or post-stage power amplifier. Similarly, in other further embodiments, the input end of the detection circuit 210 may also be coupled to an output end of a power amplifier (e.g., an output end of a same-stage, pre-stage, and/or post-stage power amplifier) so as to receive an output frequency signal of the same-stage, pre-stage, or post-stage power amplifier (e.g., the amplified radio frequency signal RFa of the power amplifier 30 in FIG. 3). In this case, since the input and output RF signals of the pre-stage, same-stage, and post-stage power amplifiers may be correlated with each other (e.g., positively correlated), the detection signal Sc generated by the detection circuit 210 would be transmitted to the voltage adjustment circuit to control the operations of the compensation transistor QB2.

In an embodiment of the present invention, the core circuit 300 also comprises a blocking capacitor C, which is coupled between the input end of the power amplifier and the control end of the amplifying transistor T1 to block a direct current (DC) signal in the radio frequency signal RFin. In an embodiment of the present invention, the core circuit 300 may further comprise a resistor RE coupled between the second end of the amplifying transistor T1 and the first reference voltage end GND.

In other embodiments of the present invention, the aforementioned resistor RB2 may be omitted, and the second end of the compensation transistor QB2 may be coupled to the control end of the amplifying transistor T1. For example, a conducting wire between the second end of the compensation transistor QB2 and the control end of the amplifying transistor T1 may be used to replace the resistor RB2.

According to the above embodiments of the present invention, when the output power of the power amplifier is low, the bias transistor is turned on, and the compensation transistor is turned off. When the output power of the power amplifier is large enough, both the bias transistor and the compensation transistor are turned on, thereby providing a larger driving current. Since the equivalent resistance of the combination of the two resistors is less than the resistance of any one of the two resistors, where the two resistors are respectively coupled to the bias transistor and the compensation transistor, the bias voltage at the control end of the amplifying transistor would be maintained relatively stable. Therefore, even if the power amplifier outputs a large power, gain of the power amplifier may be still maintained, and power of the amplified RF signal output by the power amplifier may be maintained stable. Accordingly, the embodiments of the present invention would provide good power added efficiency (PAE).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power amplifier, comprising:
   an amplifying transistor configured to amplify a radio frequency (RF) signal to output an amplified RF signal, a control end of the amplifying transistor receiving the RF signal, a first end of the amplifying transistor being coupled to a first system voltage end, and a second end of the amplifying transistor being coupled to a first reference voltage end, wherein the first end of the amplifying transistor is configured to output the amplified RF signal;
   a first resistor comprising a first end and a second end and configured to provide a first resistance, and the second end of the first resistor being coupled to the control end of the amplifying transistor;
   a bias circuit comprising a bias transistor, and the bias circuit being coupled to the first end of the first resistor;
   a second resistor comprising a first end and a second end and configured to provide a second resistance, the second resistance being less than the first resistance, and the second end of the second resistor being coupled to the control end of the amplifying transistor; and
   a compensation circuit comprising a compensation transistor, and an output end of the compensation circuit being coupled to the first end of the second resistor;
   wherein when power of the RF signal is a first power, the bias transistor is turned on, and the compensation transistor is turned off; and
   wherein when the power of the RF signal is a second power, both the bias transistor and the compensation transistor are turned on.

2. A power amplifier, comprising:
   an amplifying transistor configured to amplify a radio frequency (RF) signal to output an amplified RF signal, a control end of the amplifying transistor receiving the RF signal, a first end of the amplifying transistor being coupled to a first system voltage end, and a second end of the amplifying transistor being coupled to a first reference voltage end, wherein the first end of the amplifying transistor is configured to output the amplified RF signal;
   a first resistor comprising a first end and a second end and configured to provide a first resistance, and the second end of the first resistor being coupled to the control end of the amplifying transistor;
   a bias circuit comprising a bias transistor, and the bias circuit being coupled to the first end of the first resistor;
   a second resistor comprising a first end and a second end and configured to provide a second resistance, the second resistance being less than the first resistance, and the second end of the second resistor being coupled to the control end of the amplifying transistor; and
   a compensation circuit comprising a compensation transistor, and an output end of the compensation circuit being coupled to the first end of the second resistor;
   wherein the compensation circuit further comprises a detection circuit configured to provide a detection signal based on power of the RF signal, and the compensation transistor provides a compensation current according to the detection signal.

3. The power amplifier of claim 2, wherein the detection circuit comprises a diode, a cathode of the diode is coupled to an input end of the detection circuit, and an anode of the diode is coupled an output end of the detection circuit.

4. The power amplifier of claim 3, wherein the detection circuit further comprises a capacitor coupled between the input end of the detection circuit and the diode or coupled between the diode and the output end of the detection circuit.

5. The power amplifier of claim 2, wherein the compensation circuit further comprises a voltage adjustment circuit, an input end of the voltage adjustment circuit is coupled to the detection circuit, and an output end of the voltage adjustment circuit is configured to provide an adjustment voltage to a control end of the compensation transistor, and the voltage adjustment circuit adjusts the adjustment voltage according to the detection signal.

6. The power amplifier of claim 5, wherein the compensation transistor is turned on/off according to the adjustment voltage, wherein when the compensation transistor is turned on, the compensation transistor provides the compensation current flowing to the control end of the amplifying transistor.

7. The power amplifier of claim 5, wherein the voltage adjustment circuit comprises:
   a third resistor, a first end of the third resistor being coupled to a second reference voltage end;
   a first transistor, a first end of the first transistor being coupled to a second end of the third resistor, a second end of the first transistor being coupled to the first reference voltage end, and a control end of the first transistor being coupled to the input end of the voltage adjustment circuit;
   a fourth resistor, a first end of the fourth resistor being coupled to the second reference voltage end;
   a second transistor, a first end of the second transistor being coupled to a second end of the fourth resistor, a second end of the second transistor being coupled to the first reference voltage end, and a control end of the second transistor being coupled to the input end of the voltage adjustment circuit and coupled to the first end of the second transistor; and at least one filter coupled between the input end of the voltage adjustment circuit and the control end of the first transistor or coupled between the first end of the first transistor and the output end of the voltage adjustment circuit, wherein when a voltage level of the detection signal decreases, the adjustment voltage increases.

8. The power amplifier of claim 7, wherein the at least one filter comprises:
a first filter coupled between the input end of the voltage adjustment circuit and the control end of the first transistor; and
a second filter coupled between the first end of the first transistor and the output end of the voltage adjustment circuit.

9. The power amplifier of claim 7, wherein the bias circuit further comprises:
a reference current source, configured to provide a reference current;
a reference resistor, a first end of the reference resistor being coupled to the reference current source, and a second end of the reference resistor being coupled to a control end of the bias transistor;
at least one diode, coupled between the second end of the reference resistor and the first reference voltage end; and
a capacitor, coupled between the control end of the bias transistor and the first reference voltage end.

10. The power amplifier of claim 7, wherein the bias circuit further comprises:
a reference current source configured to provide a reference current, and an output end of the reference current source being coupled to a control end of the bias transistor; and
a third transistor, a first end of the third transistor being coupled to the output end of the reference current source, a second end of the third transistor being coupled to the first reference voltage end, and a control end of the third transistor being coupled to a second end of the bias transistor and coupled to the first end of the first resistor.

11. The power amplifier of claim 7, wherein the voltage adjustment circuit further comprises:
a fifth resistor coupled between the input end of the voltage adjustment circuit and the control end of the second transistor.

12. The power amplifier of claim 5, wherein the voltage adjustment circuit comprises:
a fifth resistor, a first end of the fifth resistor being coupled to a second reference voltage end;
a fifth transistor, a first end of the fifth transistor being coupled to a second end of the fifth resistor, a second end of the fifth transistor being coupled to the first reference voltage end, and a control end of the fifth transistor being coupled to the input end of the voltage adjustment circuit;
a sixth resistor, a first end of the sixth resistor being coupled to a second end of the bias transistor, and a second end of the sixth resistor being coupled to the input end of the voltage adjustment circuit; and
at least one filter, coupled between the input end of the voltage adjustment circuit and the control end of the fifth transistor or coupled between the first end of the fifth transistor and the output end of the voltage adjustment circuit, wherein when a voltage level of the detection signal decreases, the adjustment voltage increases.

13. The power amplifier of claim 12, wherein the at least one filter comprises:
a first filter coupled between the input end of the voltage adjustment circuit and the control end of the fifth transistor; and
a second filter coupled between the first end of the fifth transistor and the output end of the voltage adjustment circuit.

14. The power amplifier of claim 1, wherein the compensation circuit further comprises a compensation resistor coupled between a device voltage end and a first end of the compensation transistor.

15. The power amplifier of claim 1, wherein a voltage level of the first system voltage end does not change with the power of the RF signal.

16. The power amplifier of claim 1, wherein the bias circuit provides a bias current, and the compensation circuit provides a compensation current; wherein
when the power of the RF signal is the first power, the bias current is greater than the compensation current; and
when the power of the RF signal is the second power, the bias current is less than the compensation current, wherein the second power is greater than the first power.

17. The power amplifier of claim 1, wherein the first resistance is one or more hundreds times the second resistance.

18. The power amplifier of claim 1, further comprising a resistor coupled between the second end of the amplifying transistor and the first reference voltage end.

19. A power amplifier, comprising:
an amplifying transistor configured to amplify a radio frequency (RF) signal to output an amplified RF signal, a control end of the amplifying transistor receiving the RF signal, a first end of the amplifying transistor being coupled to a first system voltage end and configured to output the amplified RF signal;
a first resistor comprising a first end and a second end and configured to provide a first resistance, and the second end of the first resistor being coupled to the control end of the amplifying transistor;
a bias circuit comprising a bias transistor and coupled to the first end of the first resistor; and
a compensation circuit comprising a compensation transistor, an output end of the compensation circuit being coupled to the control end of the amplifying transistor, wherein resistance between the control end of the amplifying transistor and the bias transistor being greater than resistance between the control end of the amplifying transistor and the compensation transistor;
wherein when power of the RF signal is a first power, the bias transistor is turned on, and the compensation transistor is turned off; and
wherein when the power of the RF signal is a second power, both the bias transistor and the compensation transistor are turned on.

20. The power amplifier of claim 19, further comprising a resistor coupled between a second end of the amplifying transistor and a first reference voltage end.

* * * * *